(12) United States Patent
Nicolai et al.

(10) Patent No.: US 7,559,209 B2
(45) Date of Patent: Jul. 14, 2009

(54) LIQUID COOLING SYSTEM

(75) Inventors: Michael Nicolai, Rabenau (DE); Martin Dörrich, Sinn (DE); Heinrich Strackbein, Biebertal (DE); Markus Hain, Dillenburg (DE); Jörg Kreiling, Biebertal (DE)

(73) Assignee: Rittal GmbH & Co. KG, Herborn (DE)

( * ) Notice: Subject to any disclaimer, the term of this patent is extended or adjusted under 35 U.S.C. 154(b) by 737 days.

(21) Appl. No.: 10/525,551

(22) PCT Filed: Feb. 6, 2004

(86) PCT No.: PCT/EP2004/001084

§ 371 (c)(1),
(2), (4) Date: Feb. 24, 2005

(87) PCT Pub. No.: WO2004/080132

PCT Pub. Date: Sep. 16, 2004

(65) Prior Publication Data

US 2006/0037331 A1 Feb. 23, 2006

(30) Foreign Application Priority Data

Mar. 7, 2003 (DE) ................................. 103 10 282

(51) Int. Cl.
*F25D 23/12* (2006.01)
*H05K 7/20* (2006.01)
(52) U.S. Cl. ........................ 62/259.2; 361/699; 361/701
(58) Field of Classification Search ................. 62/259.2, 62/129; 361/688, 689, 699, 701
See application file for complete search history.

(56) References Cited

U.S. PATENT DOCUMENTS

| 5,144,811 | A | * | 9/1992 | Brodie et al. .............. 62/176.6 |
| 5,424,916 | A | | 6/1995 | Martin |
| 5,509,468 | A | | 4/1996 | Lopez |
| 5,970,729 | A | | 10/1999 | Yamamoto et al. |
| 6,509,654 | B2 | | 1/2003 | Ciliox et al. |
| 6,714,412 | B1 | * | 3/2004 | Chu et al. ................... 361/699 |

FOREIGN PATENT DOCUMENTS

| DE | G 90 03 687.5 | 7/1990 |
| DE | 196 09 651 C2 | 1/1998 |
| DE | 101 12 389 A1 | 10/2002 |
| DE | 201 21 455 U1 | 10/2002 |

(Continued)

*Primary Examiner*—Marc E Norman
(74) *Attorney, Agent, or Firm*—Pauley Petersen & Erickson

(57) ABSTRACT

A liquid cooling system having cooling units individually assigned to electronic component groups housed in a rack or a switchgear cabinet, which are to be cooled, and having a monitoring and control arrangement for monitoring a cooling temperature. Effective cooling and temperature monitoring is obtained because the cooling units are liquid cooling units and are connected via branch points to a common central liquid line system integrated into the rack or the switchgear cabinet. The control and monitoring arrangement is for monitoring the cooling temperature in the central liquid line system and for emitting an error signal when a predetermined or predeterminable threshold temperature in a liquid return branch is exceeded, or when a predetermined or predeterminable threshold temperature difference between a temperature in an inlet branch and a temperature in the return branch is exceeded, or when the liquid flow falls below a predetermined or predeterminable threshold value.

7 Claims, 2 Drawing Sheets

FOREIGN PATENT DOCUMENTS

| | | |
|---|---|---|
| EP | 0 406 763 A2 | 1/1991 |
| JP | 59119750 | 7/1984 |
| JP | 61125634 | 6/1986 |
| JP | 2113562 | 4/1990 |
| JP | 2257207 | 10/1990 |
| JP | 8233423 | 9/1996 |
| JP | 2002374086 | 4/2003 |
| WO | 97/34345 | 9/1997 |

* cited by examiner

LIQUID COOLING SYSTEM

BACKGROUND OF THE INVENTION

1. Field of the Invention

This invention relates to a liquid cooling system having several cooling units, which are individually assigned to electronic component groups housed in a rack or switchgear cabinet and which are to be cooled, and also having a monitoring and control arrangement for monitoring the cooling temperature.

2. Discussion of Related Art

A liquid cooling system is disclosed in German Patent Reference DE 196 09 651 C2 in connection with a switchgear cabinet air-conditioning arrangement. In this case, the liquid cooling system is designed, for example, as a cooling device or cooling unit with an air/water heat exchanger and represents a component of the entire air-conditioning arrangement, which is monitored and controlled or regulated by a higher-order monitoring and control arrangement. It is possible with the cooling system, together with the monitoring and control arrangement, to provide varied control concepts of the air-conditioning arrangement, depending on its type of employment or the wishes of the user. Thus there is also a possibility of locally cooling individual electronic component groups, for which purpose fan units, which are assigned to them, are triggered. However, if a rack or a switchgear cabinet has a multitude of electronic component groups with high computer output, very large amounts of heat can collect, particularly in the area of the computer units, which are difficult to remove even with such a cooling arrangement.

A switchgear cabinet monitoring and control system is taught by PCT International Publication WO 97/34345, into which an air-conditioning device with a cooling apparatus and fans, as well as heat exchangers, are integrated. A cooling concept for removing heat in the vicinity of individual component groups is not described in this publication.

SUMMARY OF THE INVENTION

One object of this invention is to provide a liquid cooling system of the type mentioned above but where cooling can be dependably provided, in particular in case of a large packing density of electronic component groups in the rack or switchgear cabinet, and heat damage to the electronic component groups can be prevented.

This object is achieved with cooling units embodied as liquid cooling units and connected via branch points to a common central liquid line system integrated into the rack or switchgear cabinet. The control and monitoring arrangement is embodied for monitoring the cooling temperature in the central liquid line system and for emitting an error signal when a predetermined or predeterminable threshold temperature in a liquid return branch is exceeded, or when a predetermined or predeterminable threshold temperature difference between a temperature in an inlet branch and a temperature in the return branch is exceeded, or when the liquid flow falls below a predetermined or predeterminable threshold value.

The electronic component groups are dependably cooled with a high degree of effectiveness by the liquid cooling units assigned to them. During this, excess heating is dependably detected by monitoring the cooling temperature and/or the flow in the central liquid line system and, if required, is taken into consideration in the system by emitting an appropriate error signal, or by appropriate processing.

Damage to the electronic component groups to be cooled is prevented dependably and simply when the error signal is used for triggering an alarm and/or switching off a common electric current supply for all electronic component groups.

Particularly effective cooling is achieved if the cooling units have cooling elements through which coolant flows, and which are thermally connected to temperature-sensitive, heat-producing electronic components.

A well arranged construction with simple connecting possibilities is obtained because the central liquid line system has a line unit with an inlet conduit and a return conduit mounted vertically in the rack or switchgear cabinet and has over its length coupling means, preferably equidistantly arranged, for forming branch points.

The steps, wherein a section of the central liquid line system extending in the rack or switchgear cabinet is attached to a vertical frame leg, to at least one mounting rail, or to the inside of a lining element, contribute to a simple construction with easy mounting options.

In this connection advantageous arrangement possibilities arise because a receptacle, open over a length toward the interior of the rack or switchgear cabinet, is integrated on or into the frame leg, into which the section of the central liquid line system is inserted.

Different embodiments for effective cooling have the central liquid line system connected to an air/liquid heat exchanger and/or a liquid/liquid heat exchanger, and the liquid/liquid heat exchanger is connected to a recooling arrangement.

BRIEF DESCRIPTION OF THE DRAWINGS

This invention is explained in greater detail in view of exemplary embodiments and by making reference to the drawings.

DESCRIPTION OF PREFERRED EMBODIMENTS

Figure 1:
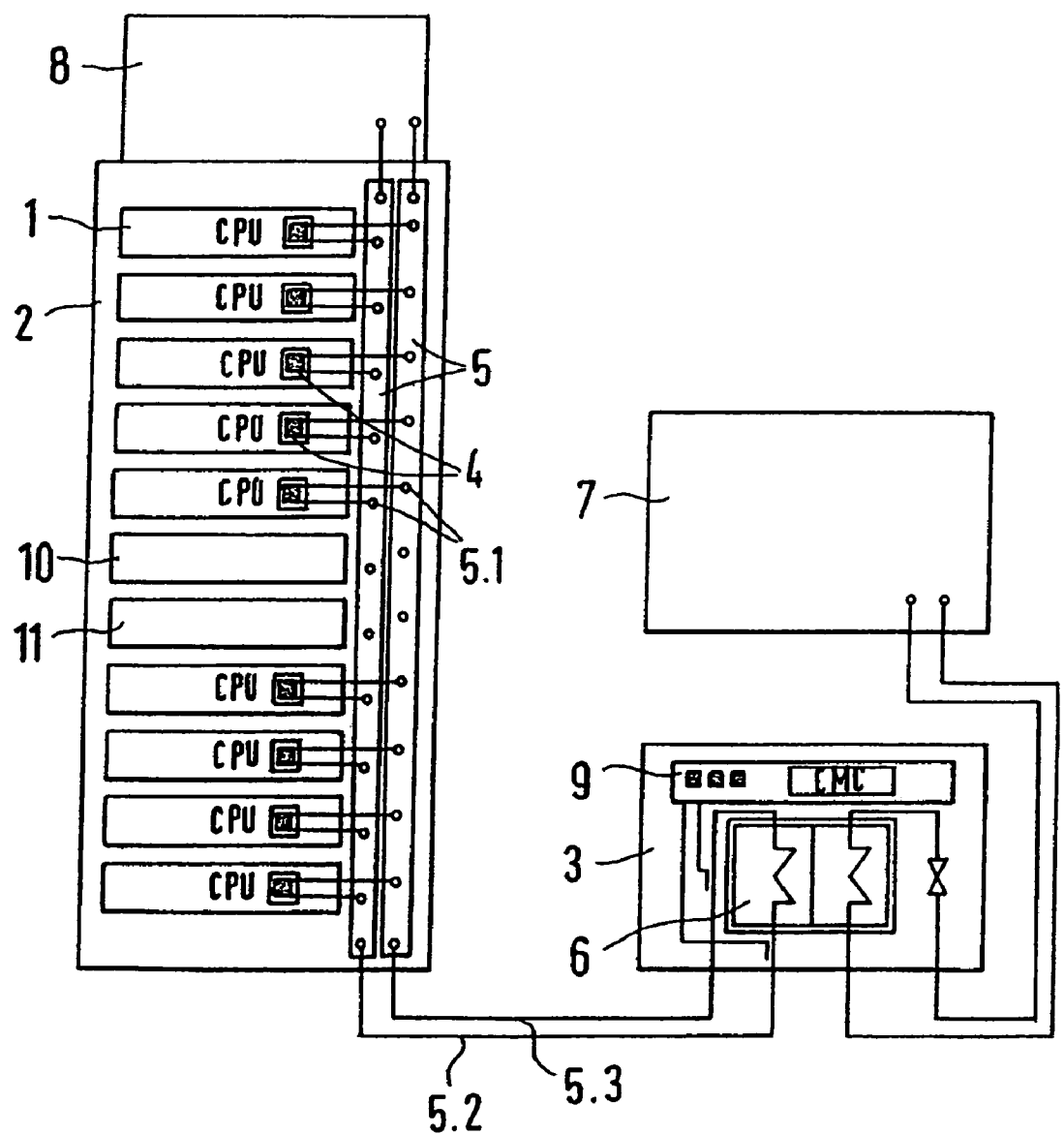
FIG. 1 shows a schematic representation of an example of a structure of a liquid cooling system for cooling a multitude of electronic component groups installed in a rack.

In FIG. 1, the electronic component groups 1 each has at least one central processing unit (CPU) 1.1 of high computing output as the main heat producer in a housing containing the electronic components group 1.

For cooling the electronic component group 1, particularly the processor units or computer units 1.1 embodied as integrated components, cooling elements 4 of the liquid cooling units, which have conduits, are applied in tight heat conducting contact to the component element body, through which the coolant is conducted over an as long as possible path. The liquid cooling units with the cooling elements 4 are connected via respective inlet branch lines and return branch lines by respective branch points 5.1 with coupling elements to a vertical section of a central liquid line system 5 extending in the rack. The central liquid line system 5 also has an inlet branch 5.2 and a return branch 5.3 for the coolant, wherein the vertical section arranged in the rack 2, or switchgear cabinet, is designed as a line unit 5.4 with the inlet branch 5.2 and the return branch 5.3.

The line unit 5.4 is connected in its lower area via a further section of the inlet branch 5.2 and the return branch 5.3 to a water/water heat exchanger 6, which is received in an electronic housing 3. A monitoring and control arrangement 9 for the functions of the switchgear cabinet or rack 2 is received in the electronic housing 3 which, inter alia, is also connected to the inlet branch 5.2 and the return branch 5.3 for detecting the temperature of the liquid, or the water, there prevailing.

A simple recooling unit or a fan arrangement is also conceivable for cooling the liquid.

The water/water heat exchanger 6 is connected via further lines to a recooling arrangement 7, which assures dependable cooling of the coolant and presents, for example, the opportunity of also giving off the created heat outside of the room in which the rack 2 or the switchgear cabinet with the electronic component groups to be cooled are located, in order to prevent too high a room temperature.

Furthermore, the upper area of the vertical section of the central liquid line system 5 is connected by further lines to an air/water heat exchanger 8 arranged on the rack 2 or switchgear cabinet, by which further cooling is achieved and wherein, with an appropriate design, the general temperature in the area of the component groups, or in the interior of the switchgear cabinet, can also be reduced.

Furthermore, by example, a monitor keyboard unit 10 and a server switch control are arranged in the rack 2 which, however, because of their low heat production, need not be connected to the central liquid line system 5.

If with temperature sensors or liquid flow monitors the monitoring and control arrangement 9 detects in or at the liquid line system that, for example, the absolute temperature in the return branch 5.3, or a temperature difference between the inlet branch 5.2 and the return branch 5.3 exceeds a predetermined or predeterminable threshold, then it emits an error signal or an error report, by which a warning light or a warning sound can be switched on, for example, or a display for informing the user can be controlled, and this can also be passed on to a remote monitoring station via a network connection. An advantageous step also is that the monitoring and control arrangement 9 is designed so that, in case of the appearance of an error signal, it switches off a common electrical current supply 1, so that no damage on account of the temperature occurs in this arrangement which, as a rule, is very expensive. Also, a more extensive computer-operated processing of the error signal, and/or the storage in a error memory device for diagnosis or later evaluation can be provided. In this case the monitoring and control arrangement 9 forms a higher-order monitoring system, with which still other sensor signals can be received and monitored, as well as various actuators of the cooling system can be controlled and regulated, such as explained in greater detail in German Patent Reference DE 196 09 651 C2 and PCT International Publication WO 97/34345.

Figure 2:
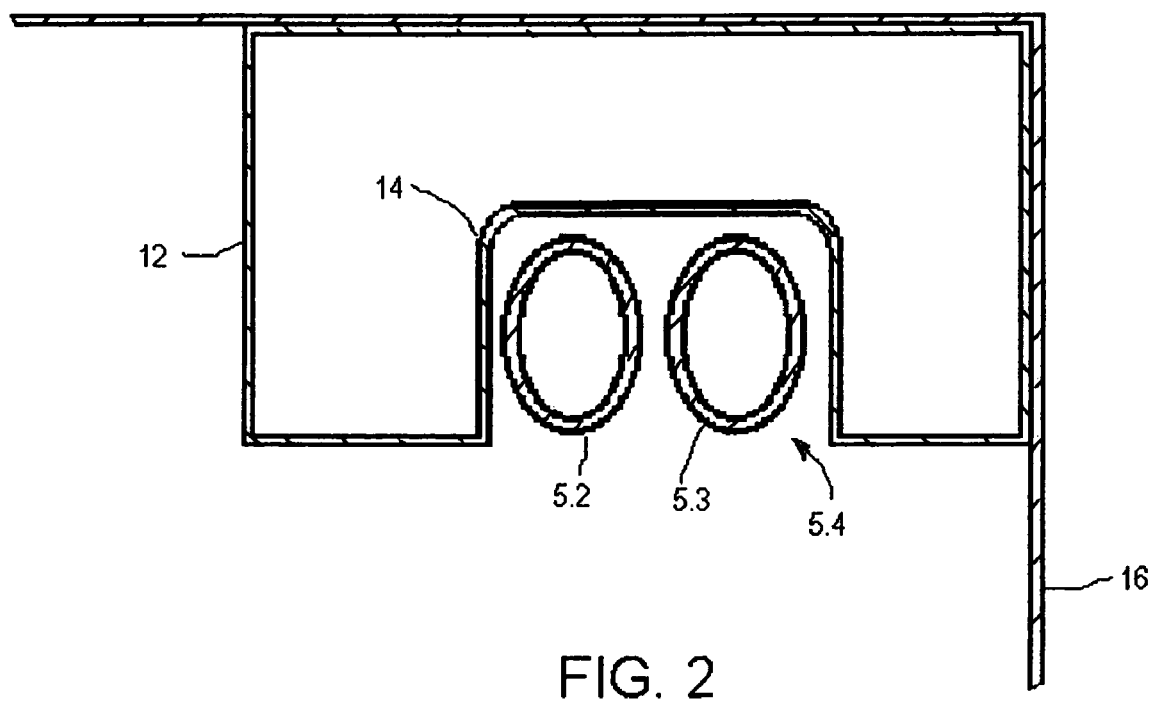
FIG. 2 shows an embodiment of the invention wherein a vertical leg frame has a U shaped receptacle.

The vertical section of the central liquid line system 5 arranged in the rack or switchgear cabinet is preferably embodied as a line unit with an inlet conduit and a return conduit, and can be separately arranged in the interior of the rack 2 or the switchgear cabinet, for example on a vertical frame leg, on mounting rails or on the inside of a lining element. An embodiment is also particularly advantageous, wherein, as shown in FIG. 2, a vertical frame leg 12 has a U-shaped receptacle 14, open over its length toward the interior of the rack 2 or switchgear cabinet 16, into which the line unit can be inserted later and fixed in place, for example snapped in place. Connecting points with coupling elements for connecting the branch lines leading to the electronic component groups 2 are provided at regular spacings over the length of the line unit 5.4.

The invention claimed is:

1. A liquid cooling system for a rack or switchgear cabinet, comprising:

liquid cooling units housed in the rack or switchgear cabinet, the liquid cooling units individually assigned to computer units, to be cooled, of electronic component groups also housed in the rack or switchgear cabinet;

a common central liquid line system integrated into the rack or switchgear cabinet, the central liquid line system including a line unit having an inlet conduit and a return conduit, at least a portion of the central liquid line system mounted vertically oriented in the rack or switchgear cabinet and provided over a length with a plurality of couplings forming branch points;

the liquid cooling units connected via the branch points to the common central liquid line system, and having cooling elements through which liquid flows;

a section of the central liquid line system attached to a vertical frame leg of the rack or switchgear cabinet, wherein a receptacle, open over its length in a direction toward an interior of the rack or switchgear cabinet, is integrated on or into the frame leg, and the section of the central liquid line system is inserted into the receptacle; and a monitoring and control arrangement monitoring the cooling temperature in the central liquid line system and emitting an error signal upon one of a predetermined or predeterminable threshold temperature in a liquid return branch being exceeded, a predetermined or predeterminable threshold temperature difference between a temperature in the inlet branch and a temperature in the return branch being exceeded, or a liquid flow disturbance falls below a predetermined or predeterminable threshold value.

2. The cooling system in accordance with claim 1, wherein an error signal at least one of triggers an alarm or switches off a common electric current supply for all electronic component groups.

3. The cooling system in accordance with claim 2, wherein the cooling units are thermally connected to temperature-sensitive, heat-producing electronic components.

4. The cooling system in accordance with claim 1, wherein the central liquid line system is connected to an air/liquid heat exchanger.

5. The cooling system in accordance with claim 1, wherein the central liquid line system is connected to a liquid/liquid heat exchanger.

6. The cooling system in accordance with claim 5, wherein the liquid/liquid heat exchanger is connected to a recooling arrangement.

7. The cooling system in accordance with claim 1, wherein the plurality of couplings are equidistantly arranged along the central liquid line system.

\* \* \* \* \*